United States Patent
Lee et al.

(10) Patent No.: US 8,987,813 B2
(45) Date of Patent: Mar. 24, 2015

(54) HIGH VOLTAGE METAL-OXIDE-SEMICONDUCTOR TRANSISTOR DEVICE

(75) Inventors: Chiu-Te Lee, Hsinchu County (TW); Ke-Feng Lin, Taipei (TW); Chih-Chien Chang, Hsinchu (TW); Wei-Lin Chen, Changhua County (TW); Chih-Chung Wang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 133 days.

(21) Appl. No.: 13/571,366

(22) Filed: Aug. 10, 2012

(65) Prior Publication Data

US 2014/0042527 A1 Feb. 13, 2014

(51) Int. Cl.
| | | |
|---|---|---|
| *H01L 29/78* | (2006.01) | |
| *H01L 29/06* | (2006.01) | |
| *H01L 29/423* | (2006.01) | |
| *H01L 29/66* | (2006.01) | |
| *H01L 29/08* | (2006.01) | |

(52) U.S. Cl.
CPC ......... *H01L 29/0653* (2013.01); *H01L 29/0696* (2013.01); *H01L 29/0878* (2013.01); *H01L 29/4236* (2013.01); *H01L 29/42376* (2013.01); *H01L 29/66704* (2013.01); *H01L 29/7825* (2013.01)
USPC .................................. 257/330; 257/E29.258

(58) Field of Classification Search
CPC . H01L 21/8242; H01L 21/336; H01L 29/772; H01L 29/7881; H01L 27/11556
USPC .................. 257/296, 298, 300, 301, E27.084, 257/E27.085, E27.09
See application file for complete search history.

(56) References Cited

U.S. PATENT DOCUMENTS

| | | | |
|---|---|---|---|
| 2005/0202628 A1* | 9/2005 | Lin et al. ........................ | 438/243 |
| 2008/0318388 A1* | 12/2008 | Lin et al. ........................ | 438/386 |
| 2009/0273029 A1* | 11/2009 | Tien et al. ...................... | 257/336 |

* cited by examiner

*Primary Examiner* — Selim Ahmed
(74) *Attorney, Agent, or Firm* — Winston Hsu; Scott Margo (57) ABSTRACT

A high voltage metal-oxide-semiconductor transistor device includes a substrate, at least an isolation structure formed in the substrate, a gate formed on the substrate, and a source region and a drain region formed in the substrate at respective sides of the gate. The isolation structure further includes a recess. The gate includes a first gate portion formed on a surface of the substrate and a second gate portion downwardly extending from the first gate portion and formed in the recess.

20 Claims, 5 Drawing Sheets

HIGH VOLTAGE METAL-OXIDE-SEMICONDUCTOR TRANSISTOR DEVICE

BACKGROUND OF THE INVENTION

1. Field of the Invention

The invention relates to a high voltage metal-oxide-semiconductor (herein after abbreviated as HV MOS) transistor device, and more particularly, to a high voltage lateral double-diffused metal-oxide-semiconductor (HV-LDMOS) transistor device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dope concentration and large area. The drift region is used to alleviate the high voltage between the drain and the source, therefore the LDMOS transistor device can have higher breakdown voltage.

A conventional HV-LDMOS transistor device having a p-type well, a source and a p-type heavily doped region formed in the p-type well, a gate and a drain is formed on a semiconductor substrate. The drain is an n-type heavily doped region formed in an n-type well, which is the drift region as mentioned above. The dope concentration and length of the drift region affects the breakdown voltage and the ON-resistance ($R_{ON}$) of the HV-LDMOS transistor device. The gate of the HV-LDMOS transistor device is positioned on a gate dielectric layer and extending to cover a portion of a field oxide layer.

It is well-known that characteristics of low $R_{ON}$ and high breakdown voltage are always required to the HV MOS transistor device. However, breakdown voltage and $R_{ON}$ are conflicting parameters with a trade-off relationship. Therefore, a HV LDMOS transistor device that is able to realize high breakdown voltage and low $R_{ON}$ is still in need.

SUMMARY OF THE INVENTION

According to the claimed invention, a HV MOS transistor device is provided. The HV MOS transistor device includes a substrate, at least an isolation structure formed in the substrate, a gate formed on the substrate, and a source region and a drain region formed in the substrate at respective sides of the gate. The isolation structure further includes a recess. The gate includes a first gate portion formed on a surface of the substrate and a second gate portion downwardly extending from the first gate portion and formed in the recess.

According to the HV MOS transistor device provided by the present invention, the recess formed in the isolation structure is filled with the second gate portion extending from the first gate portion. Consequently, current path and charge accumulation area of the HV MOS transistor device are both increased, and thus the breakdown voltage is improved without increasing $R_{ON}$, which means the $R_{ON}$/BVD ratio is desirably lowered.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
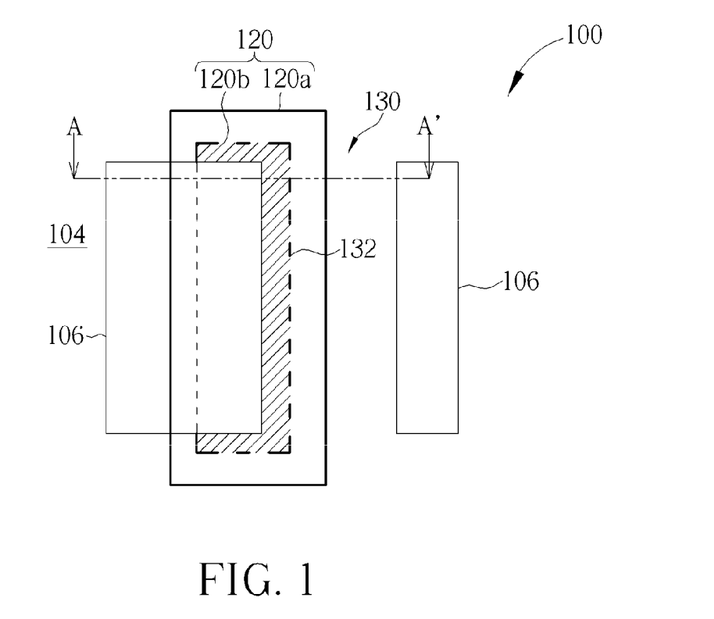
FIG. 1 is a schematic drawing of a portion of a layout pattern of a HV MOS transistor device provided by a first preferred embodiment of the present invention.
Figure 2:
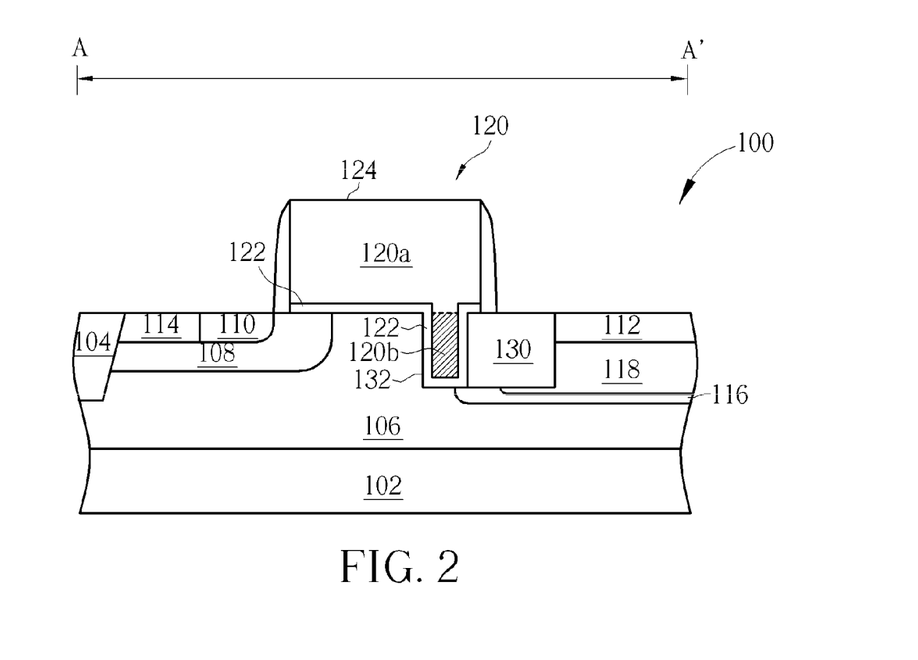
FIG. 2 is a cross-sectional view of the HV MOS transistor device taken along line A-A' of FIG. 1.

Please refer to FIGS. 1-2, FIG. 1 is a schematic drawing of a portion of a layout pattern of a HV MOS transistor device provided by a first preferred embodiment of the present invention, and FIG. 2 is a cross-sectional view of the HV MOS transistor device taken along line A-A' of FIG. 1. As shown in FIGS. 1-2, a HV MOS transistor device 100 provided by the preferred embodiment is positioned on a substrate 102, such as a silicon substrate. The substrate 102 includes a first conductivity type. In the preferred embodiment, the first conductivity type is p-type. The HV MOS transistor device 100 further includes a gate 120 positioned on the substrate 102 and an active region 106 formed in the substrate 100 while the gate 120 covers a portion of the active region 106. The active region 106 includes a second conductivity type. The second conductivity type and the first conductivity type are complementary to each other. Accordingly, the second conductivity type is n-type and the active region 106 is an n-active region 106 in the preferred embodiment. A body region 108 (shown in FIG. 2) is formed in the active region 106. The body region 108 includes the first conductivity type and thus is a p-body region 108. A source region 110 and a drain region 112 (both shown in FIG. 2) are formed in the substrate 102 at respective sides of the gate 120. Both of the source region 110 and the drain region 112 include the second conductivity type. Accordingly, the preferred embodiment provides an n-source region 110 and an n-drain region 112. As shown in FIG. 2, the source region 110 is formed in the p-body region 108. Furthermore, a p-doped region 114 is formed in the p-body region 108. The p-doped region 114 is electrically connected to the n-source region 110. Additionally, an n-type HV well 116 and an n-well 118 are formed in the active region 106 at the drain side. As shown in FIG. 2, the drain region 112 is formed in the n-well 118 and the n-well 118 is formed in the n-type HV well 116. Moreover, a plurality of shallow trench isolations (STIs) 104 for electrically isolating the HV MOS transistor device 100 from other devices and an isolation structure 130 are formed in the substrate 102. It is noteworthy that doped regions such as the source region 110, the drain region 112, the body region 108, the p-doped region 114, the n-type HV well 116, and the n-well 118 are all omitted from FIG. 1 for clarifying spatial relationships between the gate 120, the active region 106, and the isolation structure 130. However, those skilled in the art would easily realize the locations where those elements are formed according to FIG. 2, and thus those details are omitted herein in the interest of brevity.

In order to clearly describe the structure of the preferred embodiment, FIGS. 1-2 should be referred together. The isolation structure 130 of the HV MOS transistor device 100 provided by the preferred embodiment includes, for example but not limited to, a STI is formed in the substrate 102 and under the gate 120 near the drain region 112. As shown in FIG. 1, the gate 120 covers a portion of the isolation structure 130. It should be noted that according to the preferred embodiment steps as following mentioned are performed before forming the gate 120: a patterned mask (not shown) covering a portion of the isolation structure 130 is formed on the substrate 102. For example, the dotted line shown in FIG. 1 illustrates a region exposed by the patterned mask. Subsequently, an etching process is performed with a suitable etchant having high etching ratio between the doped region and the insulating material. Therefore, a recess 132 is formed in the isolation structure 130 through the patterned mask without rendering any influence to the active region 106. A depth of the recess 132 is smaller than a depth of the isolation structure 130, and a width of the recess 132 is smaller than a width of the isolation structure 130. Then, a gate dielectric layer 122 and a gate conductive layer 124 are sequentially formed on the substrate 102. The gate dielectric layer 122 is formed by any proper process such as deposition or thermal oxidation, but not limited to this. Accordingly, insulating materials are provided on each side of the recess 132. The recess 132 in the isolation structure 130 is filled by the gate conductive layer 124 and followed by performing a step to pattern the gate dielectric layer 122 and the gate conductive layer 124. Consequently, the gate 120 as shown in FIGS. 1-2 is formed on the substrate 102. It is noteworthy that since the recess 132 is filled with the gate dielectric layer 122 and the gate conductive layer 124, the obtained gate 120 includes two portions: a first gate portion 120a formed on a surface of the substrate 102 and a second gate portion 120b downwardly extending from the first gate portion 120a and formed in the recess 132 in the isolation structure 130. Furthermore, the isolation structure 130 electrically isolates the second gate portion 120b and the substrate 102. And a width and a thickness of the second gate portion 120b are both smaller than the width and the depth of the isolation structure 130.

Please still refer to FIGS. 1-2. According to the preferred embodiment, the etchant etches the isolation structure 130 through the active region 106 and the patterned mask, therefore the recess 132 and the second gate portion 120b filling the recess 132 obtain a U-shape layout pattern having an opening toward the source region 110. In other words, the second gate portion 120b includes a continuous shape and thus is a U-shaped second gate portion 120b having the opening toward the source region 110. As shown in FIG. 2, the first gate portion 120a covers the second gate portion 120b entirely. Consequently, the first gate portion 120a and the second gate portion 120b are perpendicular to each other and physically contact to each other. Accordingly, the first gate portion 120a and the second gate portion 120b form a T-shaped gate 120 in a direction vertical to the substrate 102 as shown in FIG. 2. More important, since the gate dielectric layer 122 is formed in between the first gate portion 120a and the substrate 102, and between the second gate portion 120b and the substrate 102, the T-shaped gate 120 obtains increased current path and charge accumulation area when a proper voltage is applied.

According to the HV MOS transistor device 100 provided by the preferred embodiment, the recess 132 is formed in the isolation structure 130, and thus the gate 120 having the first gate portion 120a formed on the substrate 120 and the second gate portion 120b formed in the recess 132 is obtained as mentioned above. By providing the T-shaped gate 120, which is composed of the first gate portion 120a and the second gate portion 120b, the HV MOS transistor device 100 provided by the preferred embodiment obtains increased current path and charge accumulation area. Consequently, the breakdown voltage of the HV MOS transistor device 100 is increased while $R_{ON}$ of the HV MOS transistor device 100 is decreased.

Figure 3:
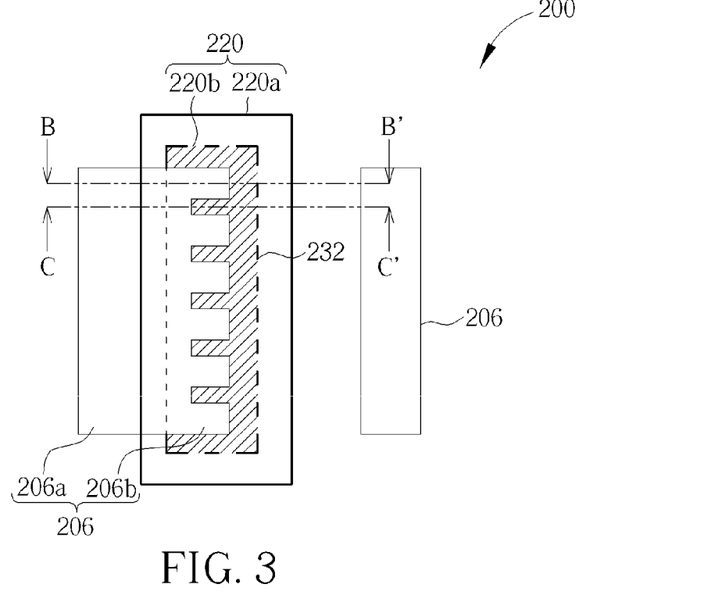
FIG. 3 is a schematic drawing of a portion of a layout pattern of a HV MOS transistor device provided by a second preferred embodiment of the present invention.
Figure 4:
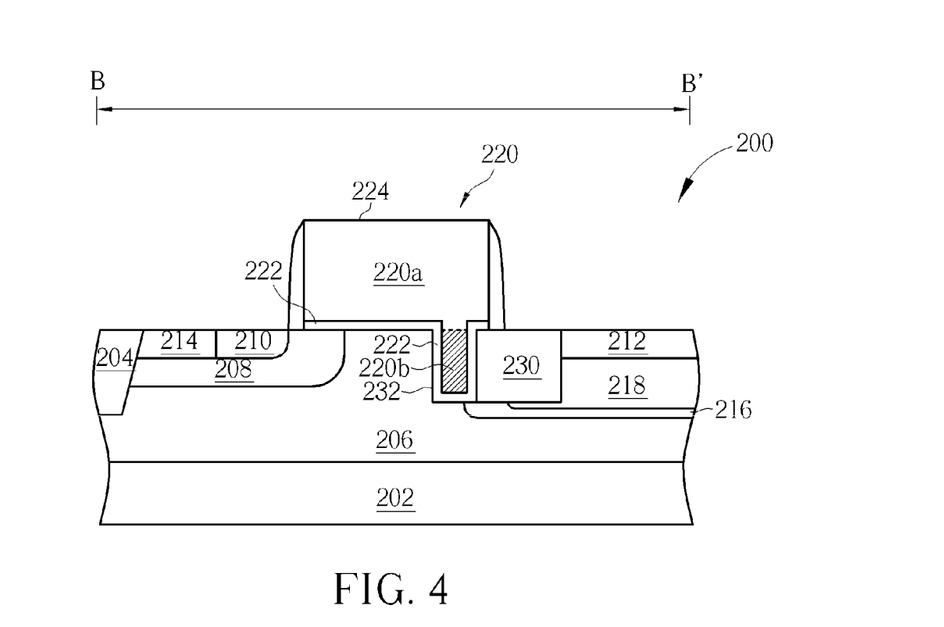
FIG. 4 is a cross-sectional view of the HV MOS transistor device taken along line B-B' of FIG. 3.
Figure 5:
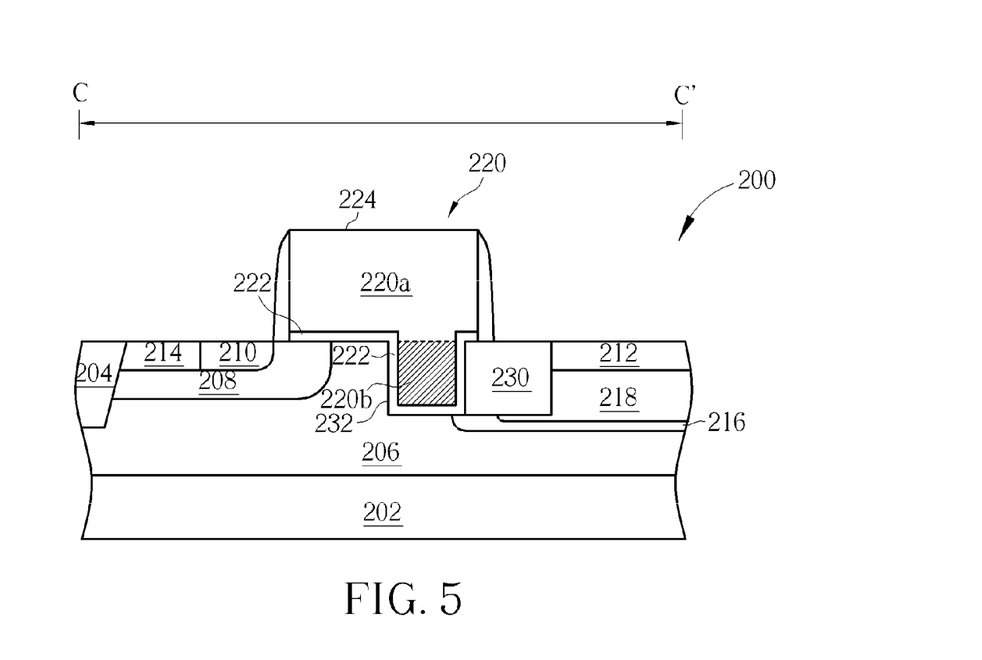
FIG. 5 is a cross-sectional view of the HV MOS transistor device taken along line C-C' of FIG. 3.

Please refer to FIGS. 3-5, FIG. 3 is a schematic drawing of a portion of a layout pattern of a HV MOS transistor device provided by a second preferred embodiment of the present invention, and FIGS. 4-5 are cross-sectional views of the HV MOS transistor device taken along line B-B' and line C-C' of FIG. 3, respectively. It should be noted that elements the same in both of the first and second preferred embodiments include the same material and conductivity type, thus those details are omitted for simplicity. As shown in FIGS. 3-5, a HV MOS transistor device 200 provided by the preferred embodiment includes a substrate 202, a gate 220 positioned on the substrate 202, and an active region 206 formed in the substrate 200 while the gate 220 covers a portion of the active region 206. A p-body region 208 (shown in FIGS. 4-5) is formed in the active region 206. An n-source region 210 and an n-drain region 212 (both shown in FIGS. 4-5) are formed in the substrate 202 at respective sides of the gate 220. Furthermore, a p-doped region 214 is formed in the p-body region 208. The relationships between the p-body region 208, the n-source region 210, the n-drain region 212, and the p-doped region 214 are identical to those described in the first preferred embodiment. Additionally, an n-type HV well 216 and an n-well 218 are formed in the active region 206 at the drain side. The relationships between the n-HV well 216, the n-well 218, and the n-drain region 212 are identical to those described in the first preferred embodiment. A plurality of STIs 204 and an isolation structure 230 are formed in the substrate 202. It is noteworthy that doped regions except the n-active region 206 are all omitted from FIG. 3 for clarifying spatial relationships between the gate 220, the active region 206, and the isolation structure 230. However, those skilled in the art would easily realize the locations where those elements are formed according to FIGS. 4-5, and thus those details are omitted herein in the interest of brevity.

Please still refer to FIG. 3. It is noteworthy that in the preferred embodiment, the active region 206 on the source side further includes a main portion 206a and a plurality of finger portions 206b. And the finger portions 206b all extend toward the drain region 212 as shown in FIGS. 3-5.

In order to clearly describe the structure of the preferred embodiment, FIGS. 3-5 should be referred together. As mentioned above, steps as following mentioned are performed before forming the gate 220: a patterned mask (not shown) is formed and followed by performing an etching process to form a recess 232 in the isolation structure 230. A depth of the recess 232 is smaller than a depth of the isolation structure 230, and a width of the recess 232 is smaller than a width of the isolation structure 230. Then, a gate dielectric layer 222 and a gate conductive layer 224 are sequentially formed on the substrate 202. As mentioned above, the obtained the gate 220 includes two portions: a first gate portion 220a formed on a surface of the substrate 202 and a second gate portion 220b downwardly extending from the first gate portion 220a and formed in the recess 232 in the isolation structure 230. And a width and a thickness of the second gate portion 220b are both smaller than the width and the depth of the isolation structure 230.

Please still refer to FIGS. 3-5. According to the preferred embodiment, the etchant etches the isolation structure 230 through the active region 206 and the patterned mask, therefore the recess 232 and the second gate portion 220b filling the recess 232 obtain a comb-shaped layout pattern as shown in FIG. 3. In other words, the second gate portion 220b includes a continuous shape and thus is a comb-shaped second gate portion 220b. Specifically a base of the comb-shaped second gate portion 220b is toward the drain region 212 and teeth of the comb-shaped second gate portion 220b are toward the source region 210. As shown in FIGS. 4-5, the first gate portion 220a covers the second gate portion 220b entirely. Consequently, the first gate portion 220a and the second gate portion 220b are perpendicular to each other and physically contact to each other. Accordingly, the first gate portion 220a and the second gate portion 220b form a T-shaped gate 220 in a direction vertical to the substrate 202 as shown in FIGS. 4-5. More important, since the gate dielectric layer 222 is formed in between the first gate portion 220a and the substrate 202, and between the second gate portion 220b and the substrate 202, the T-shaped gate 220 obtains increased current path and charge accumulation area when a proper voltage is applied.

According to the HV MOS transistor device 200 provided by the preferred embodiment, the recess 232 is formed in the isolation structure 230 and thus the gate 220 having the first gate portion 220a formed on the substrate 220 and the second gate portion 220b formed in the recess 232 is obtained as mentioned above. By providing the T-shaped gate 220, which is composed of the first gate portion 220a and the second gate portion 220b, the HV MOS transistor device 200 provided by the preferred embodiment obtains increased current path and charge accumulation area. Consequently, the breakdown voltage of the HV MOS transistor device 200 is increased while $R_{ON}$ of the HV MOS transistor device 200 is decreased. Furthermore, by providing the finger portions 206b extending toward the drain region 212 from the main portion 206a, a channel width is increased and thus electrical performance of the HV MOS transistor device 200 provided by the preferred embodiment is further improved.

Figure 6:
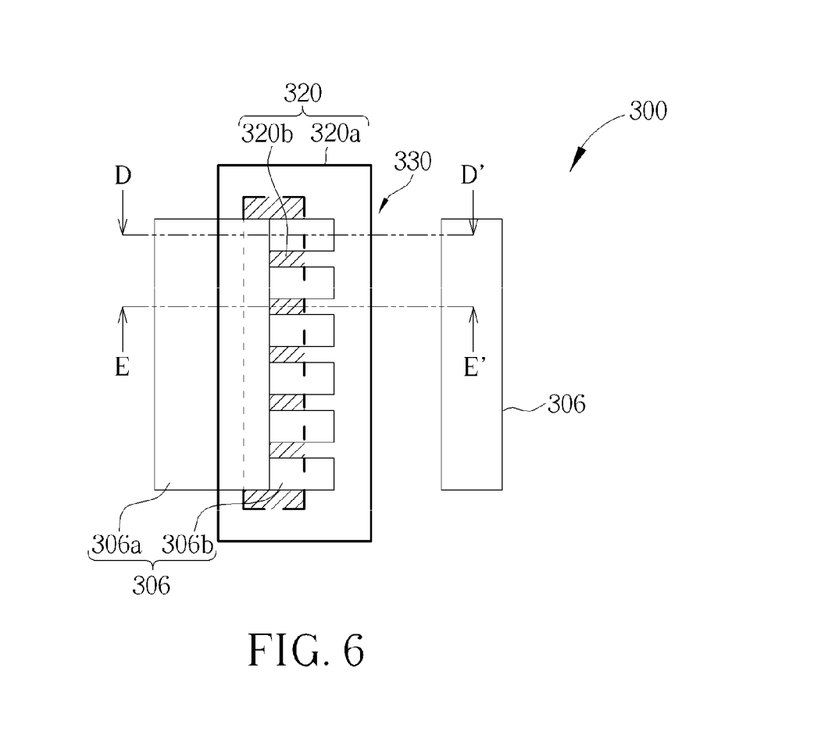
FIG. 6 is a schematic drawing of a portion of a layout pattern of a HV MOS transistor device provided by a third preferred embodiment of the present invention.
Figure 7:
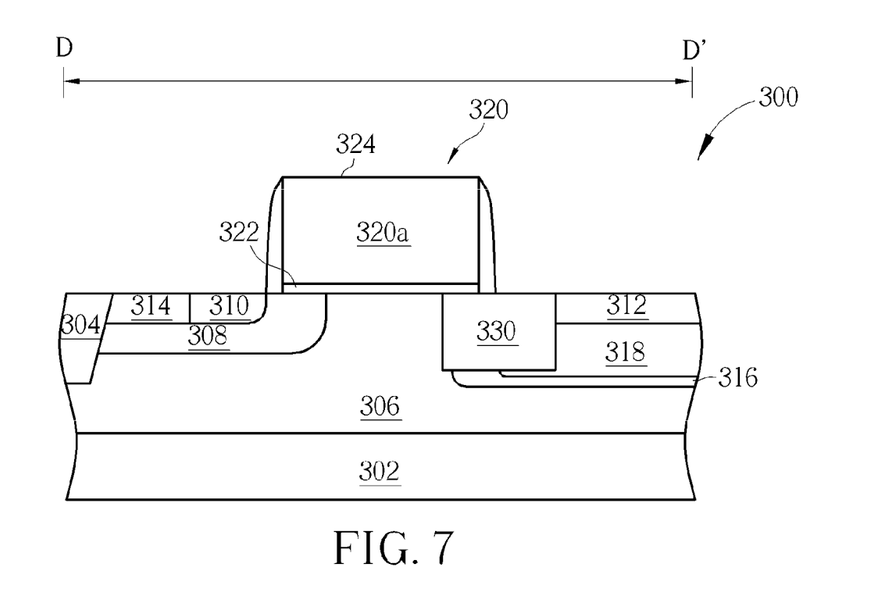
FIG. 7 is a cross-sectional view of the HV MOS transistor device taken along line D-D' of FIG. 6.
Figure 8:
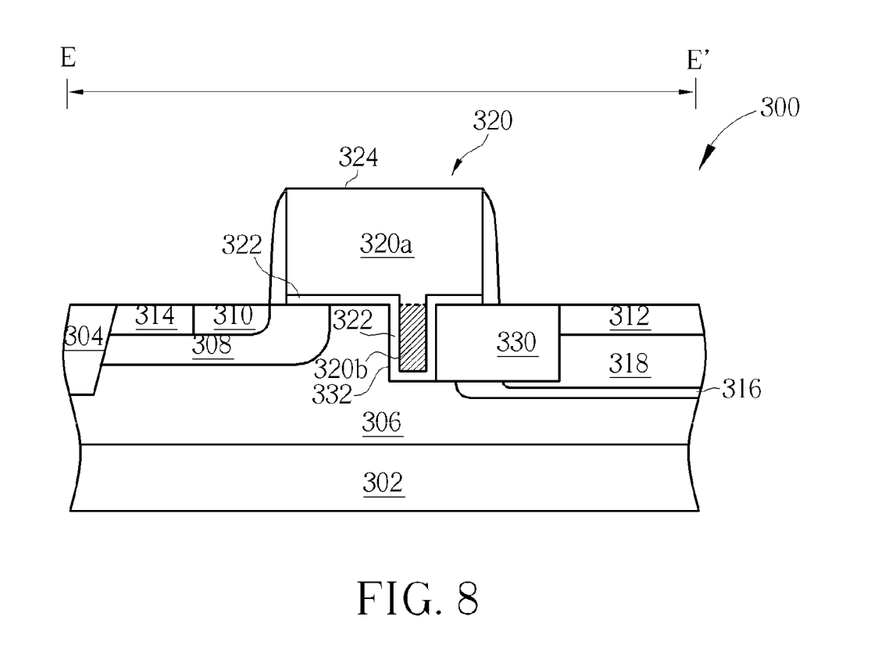
FIG. 8 is a cross-sectional view of the HV MOS transistor device taken along line E-E' of FIG. 6.

Please refer to FIGS. 6-8, FIG. 6 is a schematic drawing of a portion of a layout pattern of a HV MOS transistor device provided by a third preferred embodiment of the present invention, and FIGS. 7-8 are cross-sectional views of the HV MOS transistor device taken along line D-D' and line E-E' of FIG. 6, respectively. It should be noted that elements the same in all of the three preferred embodiments include the same material and conductivity type, thus those details are omitted for simplicity. As shown in FIGS. 6-8, a HV MOS transistor device 300 provided by the preferred embodiment includes a substrate 302, a gate 320 positioned on the substrate 302, and an active region 306 formed in the substrate 300 while the gate 320 covers a portion of the active region 306. The HV MOS transistor device 300 further includes a p-body region 308, an n-source region 310, an n-drain region 312, a p-doped region 314, an n-HV well 316, an n-well 318, STIs 304 and an isolation structure 330. The relationships between those abovementioned elements are identical to the first preferred embodiment, thus those details are omitted. It is noteworthy that doped regions except the n-active region 306 are all omitted from FIG. 6 for clarifying spatial relationships between the gate 320, the active region 306, and the isolation structure 330. However, those skilled in the art would easily realize the locations where those elements are formed according to FIGS. 7-8, and thus those details are omitted herein in the interest of brevity.

Please still refer to FIG. 6. It is noteworthy that in the preferred embodiment, the active region 306 on the source side further includes a main portion 306a and a plurality of finger portions 306b. And the finger portions 306b extend toward the drain region 312 as shown in FIGS. 6-8.

In order to clearly describe the structure of the preferred embodiment, FIGS. 6-8 should be referred together. As mentioned above, steps as following mentioned are performed before forming the gate 320: a patterned mask (not shown) covering a portion of the isolation structure 330 is formed and followed by performing an etching process to form a recess 332 in the isolation structure 330. A depth of the recess 332 is smaller than a depth of the isolation structure 330, and a width of the recess 332 is smaller than a width of the isolation structure 330. Then, a gate dielectric layer 322 and a gate conductive layer 324 are sequentially formed on the substrate 302. It is noteworthy that since the recess 332 is filled with the gate dielectric layer 322 and the gate conductive layer 324, the obtained the gate 320 includes two portions: a first gate portion 320a formed on a surface of the substrate 302 and a second gate portion 320b downwardly extending from the first gate portion 320a and formed in the recess 332 in the isolation structure 330.

Please still refer to FIGS. 6-8. According to the preferred embodiment, the etchant etches the isolation structure 330 through the active region 306 and the patterned mask, therefore the recess 332 and the second gate portion 320b filling the recess 332 obtain a non-continuous layout pattern such as an islanding pattern. In other words, each of the second gate portions 220b includes a non-continuous shape and thus is an islanding second gate portion 320b. And the isolation structure 330 interrupts into the islanding second gate portions 320b as shown in FIG. 6. As shown in FIGS. 7-8, the first gate portion 320a covers the second gate portion 320b entirely. Consequently, the first gate portion 320a and the second gate portion 320b are perpendicular to each other and physically contact to each other. Accordingly, the first gate portion 320a and the second gate portion 320b form a T-shaped gate 320 in a direction vertical to the substrate 302 as shown in FIGS. 7-8. More important, since the gate dielectric layer 322 is formed in between the first gate portion 320a and the substrate 302, and between the second gate portion 320b and the substrate 302, the T-shaped gate 320 obtains increased current path and charge accumulation area when a proper voltage is applied.

According to the HV MOS transistor device 300 provided by the preferred embodiment, the recess 332 is formed in the isolation structure 330 and thus the gate 320 having the first gate portion 320a formed on the substrate 320 and the second gate portion 320b formed in the recess 332 is obtained as mentioned above. By providing the T-shaped gate 320, which is composed of the first gate portion 320a and the second gate portion 320b, the HV MOS transistor device 300 provided by the preferred embodiment obtains increased current path and charge accumulation area. Consequently, the breakdown voltage of the HV MOS transistor device 300 is increased while $R_{ON}$ of the HV MOS transistor device 300 is decreased. Furthermore, by providing the finger portions 306b extending from the main portion 306a, a channel width is increased and thus electrical performance of the HV MOS transistor device 300 provided by the preferred embodiment is further improved.

According to the first to third preferred embodiments, it is found that during forming the recess 132/232/332 of the HV MOS transistor device 100/200/300, the recess 132/232/332 having different shapes is obtained by adjusting spatial relationship between the patterned mask and the active region 106/206/306 (and the finger portions 206b/306b formed therein), and thus the second gate portion 120b/220b/320b having different shapes is resulted. When patterned mask is positioned near the drain side, the second gate portion 120b/220b/320b obtains a continuous shape such as the U shape having the opening toward the source region 110 as shown FIG. 1. When the patterned mask is positioned slightly near the source side, the second gate portion 120b/220b/320b obtains a continuous shape such as the comb shape as shown FIG. 3. When the patterned mask is further nearer the source side, the second gate portion 120b/220b/320b obtains the non-continuous islanding shape. Briefly speaking, the second gate portion 120b/220b/320b of the present invention can include different shapes by adjusting spatial relationship between the patterned mask and the active region 106/206/306 (and the finger portions 206b/306b formed therein) to satisfy different product requirements.

Figure 9:
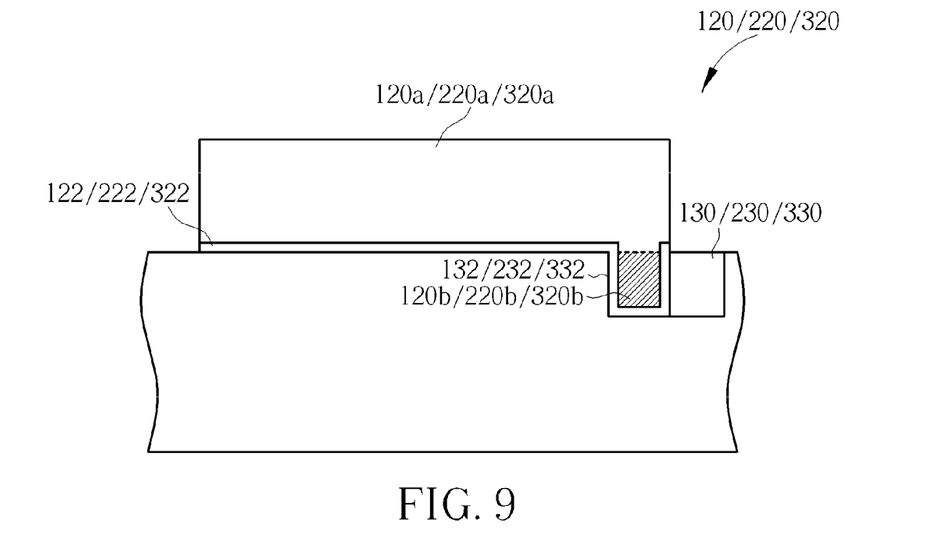
FIGS. 9-10 are schematic drawings illustrating modifications to the preferred embodiment, respectively.
Figure 10:
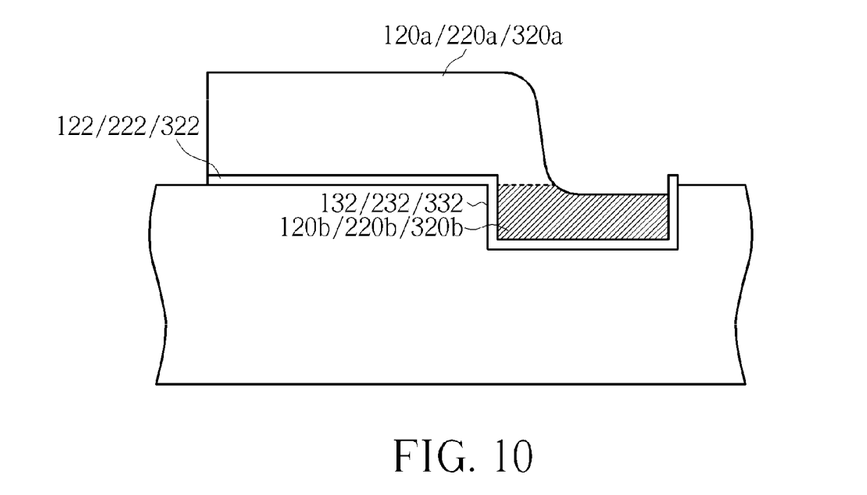

Please refer to FIGS. 9-10, which are schematic drawings illustrating modifications to the preferred embodiment, respectively. It should be noted that only the gate and the isolation structure are illustrated in FIGS. 9-10 for clarifying the relationship between the gate and the isolation structure, however those skilled in the art would easily realize locations or positions of other elements of the HV MOS transistor according to the abovementioned first to third preferred embodiment. And thus those details are omitted for simplicity. It is also should be noted that the gate and the isolation structure shown in FIGS. 9-10 can be adopted to the first to third preferred embodiment as long as required.

As shown in FIG. 9, though the first gate portion 120a/220a/320a of the gate 120/220/320 still covers the second gate portion 120b/220b/320b entirely, the first gate portion 120a/220a/320a and the second gate portion 120b/220b/320b form an L-shaped gate, instead of the T-shaped gate, according to the modification to the present invention. In another modification as shown in FIG. 10, during forming the recess 132/232/332 in the isolation structure 130/230/330, the depth and the width of the recess 132/232/332 can be smaller than or equal to the depth and the width of the isolation structure 130/230/330. Therefore the second gate portion 120b/220b/320b formed in the recess 132/232/332 obtains larger width and thickness. Since the first gate portion 120a/220a/320a covers a portion of the second gate portion 120b/220b/320b as shown in FIG. 10, the current path is increased. Furthermore, since the depth and the width of the recess 132/232/332 can be substantially equal to the depth and the width of the isolation structure 130/230/330, the recess 132/232/332 may be fully filled or not-fully filled by the gate conductive layer 124/224/324.

Accordingly, it is conceivable that modifications to the present invention relates to the size of the recess 132/232/332 in the isolation structure 130/230/330. It is noteworthy that there is a rule for the modifications to the present invention: the depth and the width of the recess 132/232/330 are equal to or smaller than the depth and the width of the isolation structure 130/230/330. Accordingly, the thickness and the width of the second gate portion 120b/220b/320b formed in the isolation structure 130/230/330 inheritably are equal to or smaller than the depth and the width of the isolation structure 130/230/330.

According to the HV MOS transistor device provided by the present invention, the recess formed in the isolation structure is filled with the second gate portion extending from the first gate portion. By adjusting relationships between the patterned mask and the active region (and the finger portions formed therein), the recess and the second gate portion formed therein includes the continuous shape such as a U shape or a comb shape, or the non-continuous shape such as the islanding shape. And by providing the second gate portion in the recess, current path and charge accumulation area are both increased, and thus the breakdown voltage is improved without increasing $R_{ON}$, which means a $R_{ON}$/BVD ratio is desirably lowered. Furthermore, by providing the finger portions, the channel width is increased and thus electrical performance of the HV MOS transistor device provided by the preferred embodiment is further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage metal-oxide-semiconductor (HV MOS) transistor device comprising:
   a substrate;
   at least an isolation structure formed in the substrate, the isolation structure having a recess formed therein;
   a gate formed on the substrate, the gate further comprising:
     a first gate portion formed on a surface of the substrate; and
     a second gate portion downwardly extending from the first gate portion and formed in the recess;
   a gate dielectric layer formed under and contacting both the first gate portion and the second gate portion; and
   a source region and a drain region formed in the substrate at respective sides of the gate.

2. The HV MOS transistor device according to claim 1, wherein the first gate portion and the second gate portion are perpendicular to each other.

3. The HV MOS transistor device according to claim 1, wherein the first gate portion and the second gate portion physically contact to each other.

4. The HV MOS transistor device according to claim 1, wherein the second gate portion comprises a continuous shape.

5. The HV MOS transistor device according to claim 4, wherein the second gate portion comprises a U-shaped second gate portion having an opening toward the source region.

6. The HV MOS transistor device according to claim 4, wherein the second gate portion comprises a comb-shaped second gate portion.

7. The HV MOS transistor device according to claim 1, wherein the second gate portion comprises a non-continuous islanding second gate portion.

8. The HV MOS transistor device according to claim 7, wherein the isolation structure interrupts into the non-continuous islanding second gate portion.

9. The HV MOS transistor device according to claim 1, wherein the first gate portion covers the second gate portion entirely.

10. The HV MOS transistor device according to claim 9, wherein the first gate portion and the second gate portion form a T-shaped gate.

11. The HV MOS transistor device according to claim 9, wherein the first gate portion and the second gate portion form an L-shaped gate.

12. The HV MOS transistor device according to claim 9, wherein the first gate portion covers a portion of the second gate portion.

13. The HV MOS transistor device according to claim 1, wherein the isolation structure electrically isolates the second gate portion and the substrate.

14. The HV MOS transistor device according to claim 1, wherein the gate dielectric layer is formed in between the first gate portion and the substrate.

15. The HV MOS transistor device according to claim 14, wherein the gate dielectric layer is further formed in between the second gate portion and the substrate.

16. The HV MOS transistor device according to claim 1, wherein a depth of the recess is smaller than a depth of the isolation structure.

17. The HV MOS transistor device according to claim 16, wherein a thickness of the second gate portion is smaller than the depth of the recess.

18. The HV MOS transistor device according to claim 1, wherein a width of the second gate portion is smaller than a width of the isolation structure.

19. The HV MOS transistor device according to claim 1, further comprising a doped region formed in the substrate, and the gate covers a portion of the doped region.

20. The HV MOS transistor device according to claim 19, wherein the doped region further comprises a plurality of finger portions extending toward the drain region.

* * * * *